United States Patent
Kim

(10) Patent No.: US 7,619,359 B2
(45) Date of Patent: Nov. 17, 2009

(54) ORGANIC ELECTROLUMINESCENT DISPLAY HAVING SEALANT WITH GRAINS AND METHOD FOR MANUFACTURING THE SAME

(75) Inventor: Hong Gyu Kim, Uiwang-si (KR)

(73) Assignee: LG Display Co., Ltd., Seoul (KR)

( * ) Notice: Subject to any disclaimer, the term of this patent is extended or adjusted under 35 U.S.C. 154(b) by 274 days.

(21) Appl. No.: 11/143,584

(22) Filed: Jun. 3, 2005

(65) Prior Publication Data

US 2005/0269952 A1 Dec. 8, 2005

(30) Foreign Application Priority Data

Jun. 4, 2004 (KR) ...................... 10-2004-0040827

(51) Int. Cl.
   *H01J 1/62* (2006.01)
(52) U.S. Cl. .................. 313/512; 313/504; 313/506
(58) Field of Classification Search ............... 313/504, 313/506, 512
   See application file for complete search history.

(56) References Cited

U.S. PATENT DOCUMENTS

| | | | | |
|---|---|---|---|---|
| 4,688,900 | A |  8/1987 | Doane et al. ............... | 350/347 |
| 5,674,636 | A | 10/1997 | Dodabalapur et al. ....... | 428/690 |
| 7,012,363 | B2* |  3/2006 | Weaver et al. ............... | 313/504 |
| 7,245,065 | B2* |  7/2007 | Ghosh et al. ................ | 313/110 |
| 2001/0033135 | A1* | 10/2001 | Duggal et al. ............... | 313/506 |
| 2002/0061418 | A1 |  5/2002 | Imanishi | |
| 2002/0180371 | A1* | 12/2002 | Yamazaki et al. ......... | 315/169.3 |
| 2003/0127973 | A1* |  7/2003 | Weaver et al. ............... | 313/504 |
| 2003/0164679 | A1* |  9/2003 | Hamano et al. ............. | 313/504 |
| 2006/0290271 | A1* | 12/2006 | Cok ........................... | 313/504 |

FOREIGN PATENT DOCUMENTS

| | | |
|---|---|---|
| CN | 1498048 | 5/2004 |
| EP | 1 076 368 | 2/2001 |
| JP | 8-008061 A | 12/1996 |
| JP | 11-008075 A | 1/1999 |
| JP | 11-329742 A | 11/1999 |
| JP | 2001-043980 A | 2/2001 |
| JP | 2001-230069 A | 8/2001 |
| JP | 2002-008850 A | 11/2002 |

OTHER PUBLICATIONS

European Office Action dated Mar. 28, 2007.
Korean Office Action dated Jan. 24, 2006.
Chinese Office Action dated Jan. 4, 2008 (and English-language translation).
Takashi Yamasaki et al., "Organic light-emitting device with an ordered monolayer of silica microspheres as a scattering medium;" Applied Physics Letters, vol. 76, No. 10, pp. 1243-1245, Mar. 6, 2000.

* cited by examiner

*Primary Examiner*—Peter Macchiarolo
(74) *Attorney, Agent, or Firm*—Holland & Knight LLP

(57) ABSTRACT

An organic electro-luminescent display and a method for manufacturing the same are disclosed. The organic electro-luminescent display includes a transparent substrate, an anode formed over the transparent substrate, an organic electro-luminescent layer formed over the anode, a cathode formed over the organic electro-luminescent layer, a protective film formed over the cathode, the protective film having a multi-layer structure, and a sealant formed over the protective film, and provided with small grains distributed in the sealant.

14 Claims, 7 Drawing Sheets

ORGANIC ELECTROLUMINESCENT DISPLAY HAVING SEALANT WITH GRAINS AND METHOD FOR MANUFACTURING THE SAME

This application claims the benefit of Korean Patent Application No. 10-2004-0040827, filed on Jun. 4, 2004, which is hereby incorporated by reference as if fully set forth herein.

BACKGROUND OF THE INVENTION

1. Field of the Invention

The present invention relates to an organic electro-luminescent (EL) display, and more particularly, to a top emission type organic EL display and a method for manufacturing the same.

2. Discussion of the Related Art

Generally, organic EL displays include, for each pixel region thereof, a switching thin film transistor for switching of a pixel corresponding to the pixel region, a driving thin film transistor for driving of the pixel, a storage capacitor, an anode (pixel electrode, an organic light-emitting layer, and a cathode (common electrode).

Hereinafter, a conventional method for manufacturing such an organic EL display will be described.

FIGS. 1A to 1E are sectional views illustrating sequential processing steps of the conventional organic EL display manufacturing method. The following description will be given only in conjunction with one thin film transistor included in one pixel of the organic EL display.

In accordance with the conventional method, first, a semiconductor layer 2 made of, for example, polysilicon, is formed over a glass substrate 1, as shown in FIG. 1A. The semiconductor layer 2 is then patterned such that the semiconductor layer 2 remains only in a region where the thin film transistor is to be formed.

Thereafter, a gate insulating film 3 and a conductive film for formation of a gate electrode are sequentially formed over the entire surface of the resulting structure. The conductive film is then patterned to form a gate electrode 4.

Using the gate electrode 4 as a mask, impurity ions such as boron (B) ions or phosphorous (P) ions are then implanted into the semiconductor layer 2 which is, in turn, annealed to form source and drain regions 2a and 2c of the thin film transistor.

The portion of the semiconductor layer 2, into which the impurity ions are not implanted, forms a channel region 2b of the thin film transistor.

Next, an interlayer insulating film 5 is formed over the entire surface of the resulting structure. Subsequently, the interlayer insulating film 5 and gate insulating film 3 are selectively removed such that the source and drain regions 2a and 2c of the thin film transistor are exposed.

Electrode lines 6 are then formed on the exposed source and drain regions 2a and 2c such that the electrode lines 6 are electrically connected to the source and drain regions 2a and 2c, respectively.

Thereafter, a planarizing insulating film 7 is formed over the entire surface of the resulting structure. The planarizing insulating film 7 is then selectively removed such that the electrode line 6 electrically connected to the drain region 2c is exposed.

Next, an anode 8 is formed on the exposed electrode line 6 such that the anode 8 is electrically connected to the exposed electrode line 6.

Thereafter, an insulating film 9 is formed between the anode 8 and another anode 8 included in a neighboring pixel, as shown in FIG. 1B.

Subsequently, a hole injection layer 10, a hole transfer layer 11, a light-emitting layer 12, an electron transfer layer 13, and an electron injection layer 14 are sequentially formed over the entire surface of the resulting structure, as shown in FIG. 1C.

Next, a metal cathode 15 and an auxiliary cathode 16 are sequentially formed over the entire surface of the resulting structure, as shown in FIG. 1D. A protective film 17 is also formed over the auxiliary cathode 16 in order to prevent penetration of oxygen and moisture.

For the protective film 17, a multi-layer thin film is generally used. In this case, the protective film 17 not only effectively prevents penetration of moisture and oxygen, but also serves as a micro-cavity, thereby providing an optimally laminated structure. That is, the protective film 17 can greatly enhance the color purity of the display when the refractive index and thickness of each layer in the protective film 17 is optimized.

Thereafter, a sealant 18 is coated over the protective film 17, as shown in FIG. 1E. A transparent protective cap 19, which may be made of glass, is attached to the upper surface of the sealant 18. Thus, a top emission type organic EL display is completely manufactured.

The organic EL display manufactured in the above-mentioned manner exhibits an improvement in luminance and color purity because the protective film has a multi-layer thin film structure. However, the organic EL display exhibits degraded characteristics in terms of viewing angle because of the multi-layer thin film structure of the protective film.

That is, the conventional organic EL display has a problem in that there is a degradation in display quality because of a remarkable degradation in viewing angle caused by the multi-layer protective film, even though the multi-layer protective film provides an improvement in luminance and color purity.

SUMMARY OF THE INVENTION

Accordingly, the present invention is directed to an organic EL display and a method for manufacturing the same that substantially obviate one or more problems due to limitations and disadvantages of the related art.

An object of the present invention is to provide an organic EL display which includes a protective film with a novel structure capable of not only achieving an improvement in luminance and color purity, but also achieving an improvement in viewing angle, and a method for manufacturing the organic EL display.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic electro-luminescent display comprises: a transparent substrate; an anode formed over the transparent substrate; an organic electro-luminescent layer formed over the anode; a cathode formed over the organic electro-luminescent layer; a protective film formed over the cathode, the protective film having a multi-layer structure; and a sealant formed over the protective film, and provided with small grains distributed in the sealant.

The small grains distributed in the sealant may be made of one selected from a group consisting of silicon, an oxide, and a nitride, and may have a spherical shape or a polygonal shape.

The small grains distributed in the sealant may be made of one selected from a group consisting of a transparent material, an opaque material, and a mixture thereof. The transparent material may be selected from a group consisting of a silicon, an oxide, and a nitride. The opaque material may be a metal.

The small grains distributed in the sealant may be irregularly arranged, or may be regularly arranged while being spaced apart from one another by a predetermined distance.

The small grains distributed in the sealant may be made of a material having a refractive index different from a refractive index of the sealant.

The anode may be made of a metal having a high reflectivity and a high work function. The cathode may comprise a laminated structure of a transparent metal cathode and an auxiliary cathode made of a transparent conductive material.

In another aspect of the present invention, a method for manufacturing an organic electro-luminescent display, comprises the steps of: preparing a transparent substrate, and a sealant in which small grains having a refractive index different from a refractive index of the sealant are distributed; sequentially forming an anode, an organic electro-luminescent layer and a cathode over the prepared transparent substrate; forming a protective film having a multi-layer structure over the cathode; and arranging the prepared sealant on the protective film.

The step of forming the cathode may comprise the steps of forming a transparent thin metal cathode over the organic electro-luminescent layer, and an auxiliary cathode formed over the metal cathode. The auxiliary cathode may be made of a transparent conductive material.

The metal cathode may have a thin structure made of a metal material alone. Where an auxiliary cathode is used, the auxiliary cathode may be formed only on a portion of the metal cathode which has a thin structure.

The step of forming the metal cathode may comprise the steps of depositing aluminum over the organic electro-luminescent layer to a thickness of several nm, and depositing silver or an alloy of magnesium and silver over the deposited aluminum to a thickness of several nm to several tens of nm.

It is to be understood that both the foregoing general description and the following detailed description of the present invention are exemplary and explanatory and are intended to provide further explanation or the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Whenever possible, the same reference numbers will be used throughout the drawings to refer to the same or like parts.

In accordance with the present invention, an inorganic EL display is provided which includes a sealant formed over a protective film, and provided with small spherical grains distributed in the sealant.

The small spherical grains have a refractive index different from that of the sealant. The reason why the small spherical grains are distributed in the sealant is that diffused refraction of light emitted through the protective film occurs due to the small spherical grains in the sealant, so that a great improvement in viewing angle is achieved.

Hereinafter, a method for manufacturing the organic EL display having the above described structure according to the present invention will be described.

Figure 1A:
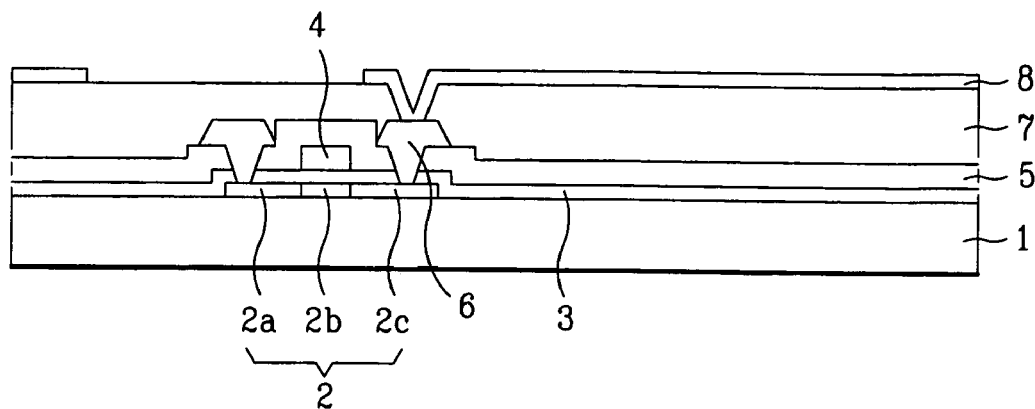
FIGS. 1A to 1E are sectional views illustrating sequential processing steps of a conventional method for manufacturing an organic EL display.
Figure 1B:
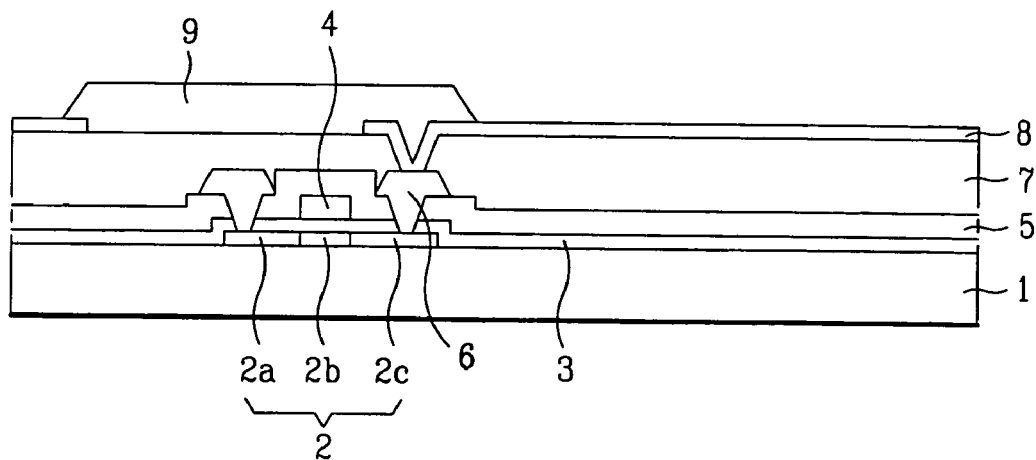
Figure 1C:
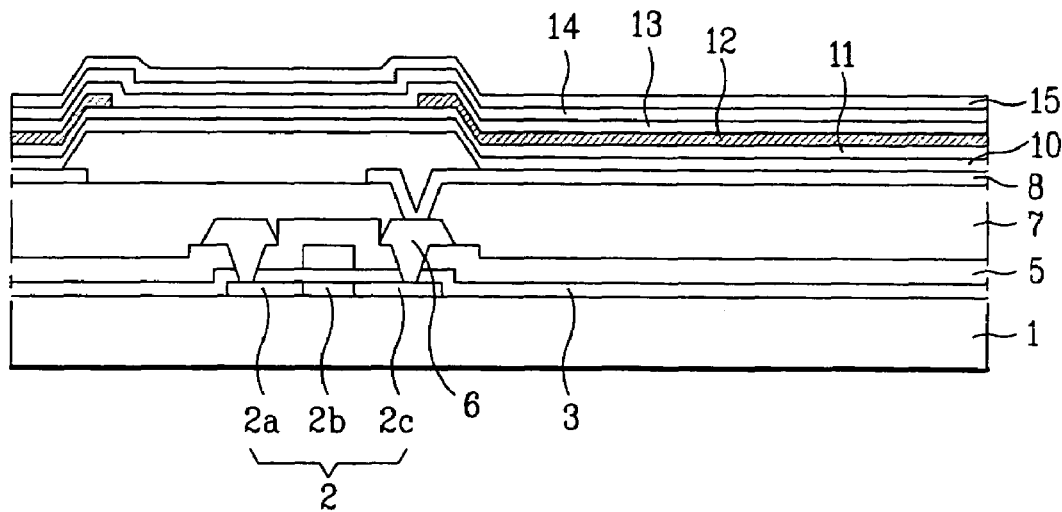
Figure 1D:
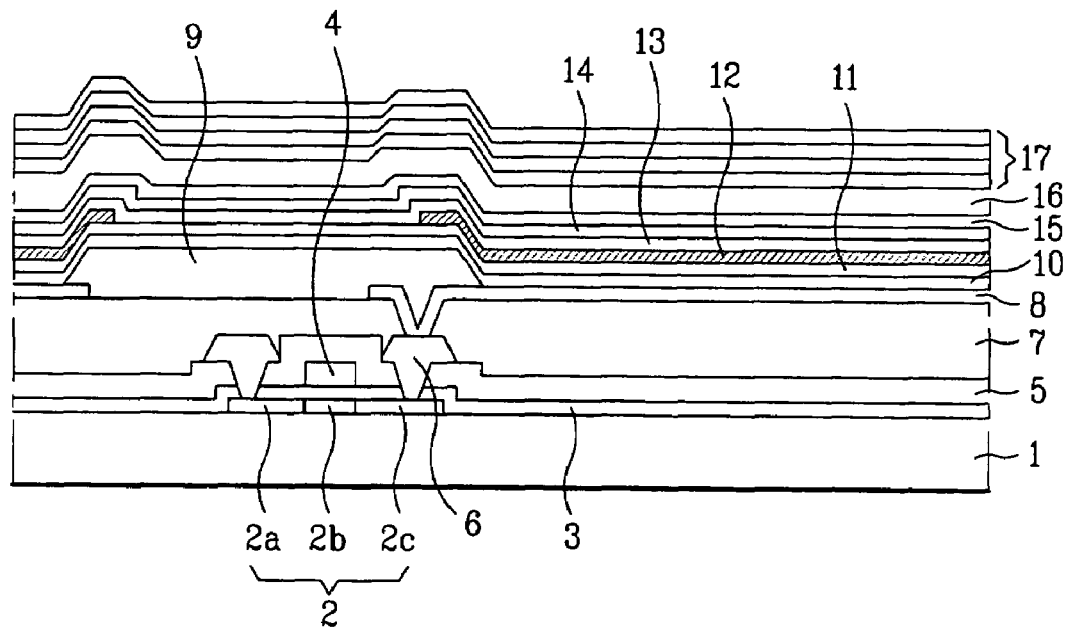
Figure 1E:
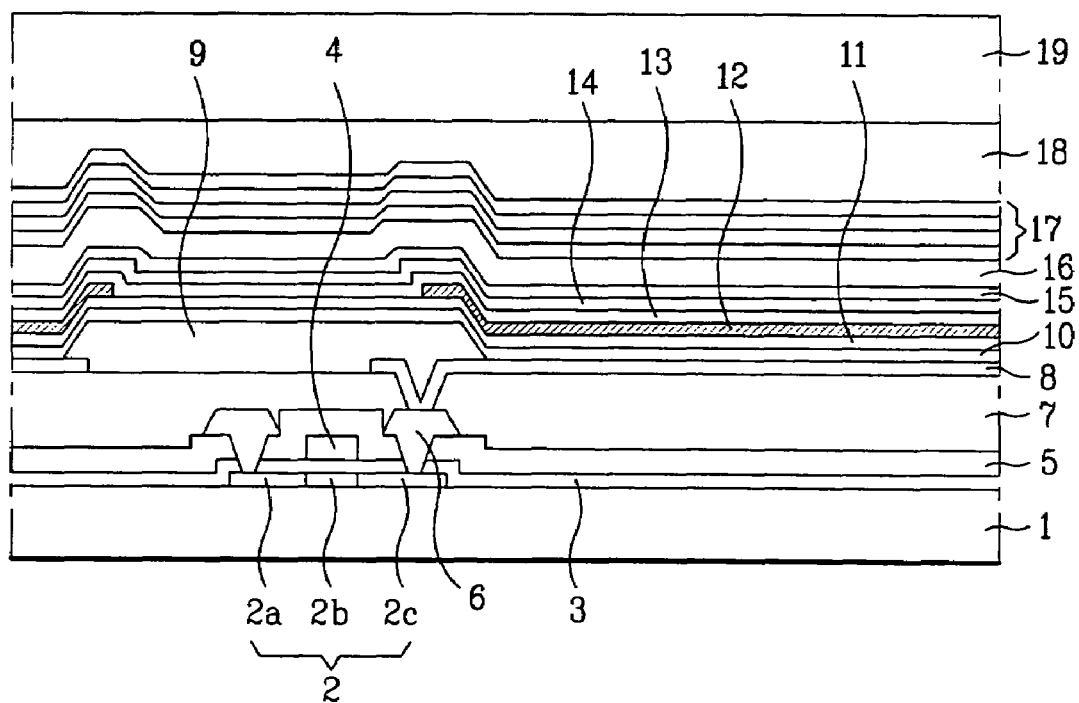
Figure 2A:
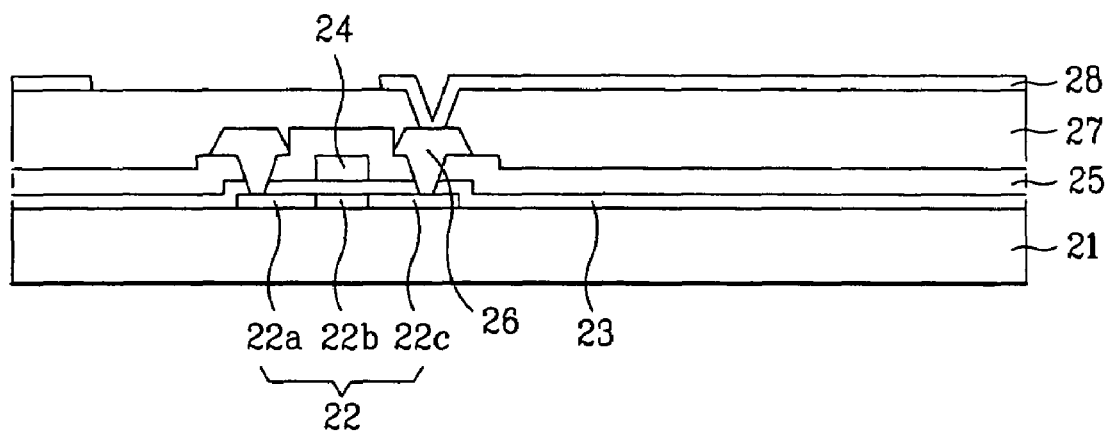
FIGS. 2A to 2E are sectional views illustrating sequential processing steps of a method for manufacturing an organic EL display in accordance with the present invention.

FIGS. 2A to 2E are sectional views illustrating sequential processing steps of the organic EL display manufacturing method according to the present invention. The following description will be given only in conjunction with one thin film transistor included in one pixel of the organic EL display. In accordance with this method, first, a semiconductor layer 22 made of, for example, polysilicon, is formed over a glass substrate (or transparent substrate) 21, as an active layer of the thin film transistor, as shown in FIG. 2A. The semiconductor layer 22 is then patterned.

Thereafter, a gate insulating film 23 is formed over the entire surface of the transparent substrate 21 including the semiconductor layer 22. A gate electrode 24 is then formed on the gate insulating film 23.

Using the gate electrode 24 as a mask, impurity ions are then implanted into the semiconductor layer 22 which is, in turn, annealed to form source and drain regions 22a and 22c of the thin film transistor.

Next, an interlayer insulating film 25 is formed over the entire surface of the transparent substrate 21 including the gate electrode 24. The interlayer insulating film 25 is then patterned to expose predetermined portions of the source and drain regions 22a and 22c.

Thereafter, electrodes 26 are formed on the interlayer insulating film 25 such that the electrodes 26 are electrically connected to the source and drain regions 22a and 22c. Thus, the thin film transistor is completely formed.

A planarizing film 27 made of an insulating material is then formed over the entire surface of the transparent substrate 21 including the thin film transistor. The planarizing film 27 is then patterned to form a contact hole for exposing a portion of the electrode on the drain region 22c.

Next, an anode 28, which is made of a conductive material having a high reflectivity and a high work function, such as Cr, Al, Mo or AgAu, is formed over the planarizing film 27.

The anode 28 is electrically connected to the exposed electrode 26 of the thin film transistor through the contact hole.

Figure 2B:
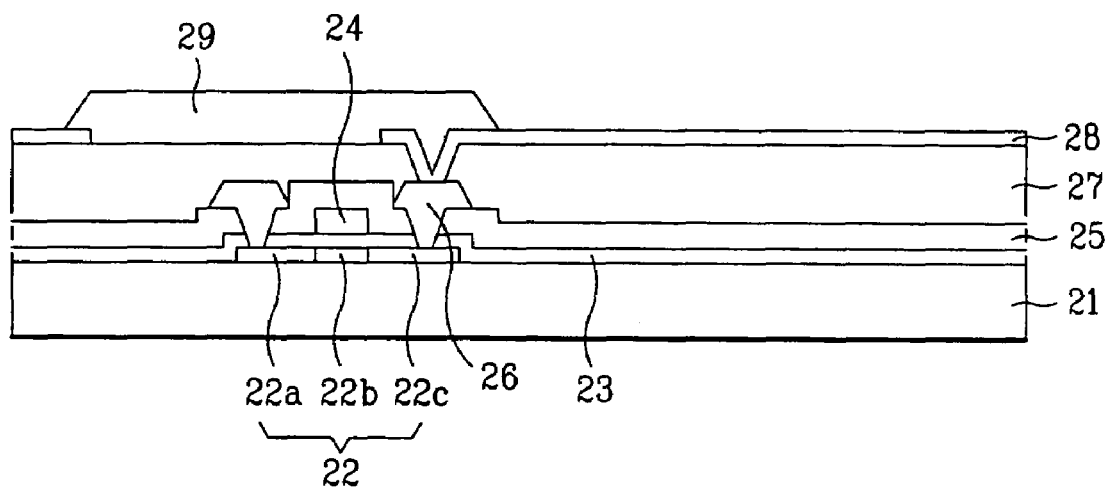
Figure 2C:
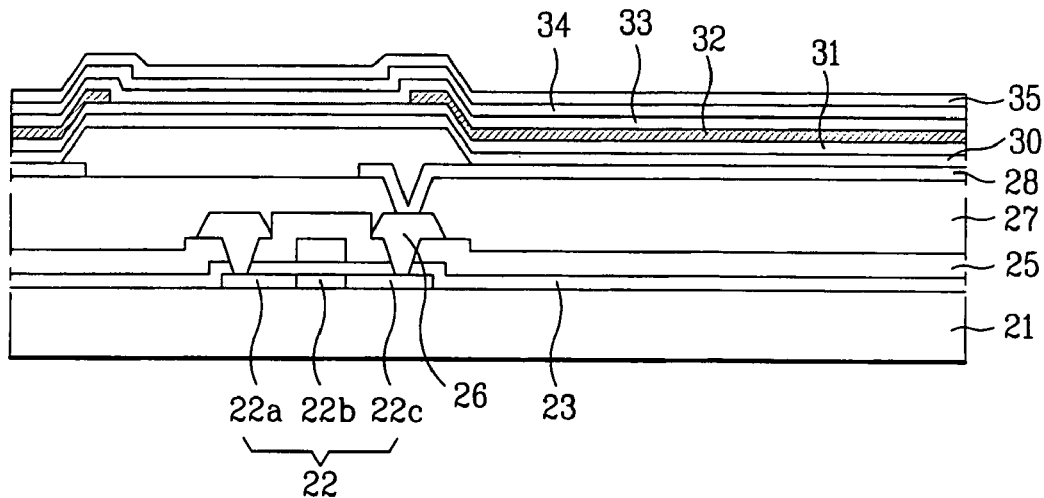

As shown in FIG. 2B, an insulating film 29 is subsequently formed over the entire surface of the transparent substrate 21 including the anode 28. The insulating film 29 is then patterned to remain in a region where the anode 28 is electrically connected with the electrode 26, and a peripheral region of the anode 28, Thereafter, a hole injection layer 30 and a hole transfer layer 31 are sequentially formed over the entire surface of the transparent substrate 21 including the insulating film 29, as shown in FIG. 2C. R, G, and B light-emitting layers 32 are formed on the hole transfer layer 31, using a shadow mask.

Next, an electron transfer layer 33 and an electron injection layer 34 are sequentially formed over the entire surface of the transparent substrate 21 including the R, G and B light-emitting layers 32. Thus, an organic EL layer is completely formed. A metal cathode 35 is then formed over the electron injection layer 34.

The metal cathode 35 is a transparent thin metal electrode. The metal cathode 35 is formed by depositing aluminum (Al) over the electron injection layer 34 to a thickness of several nm, and then depositing silver (Ag) or an Mg:Ag alloy over the deposited Al to a thickness of several nm to several tens of rm.

Figure 2D:
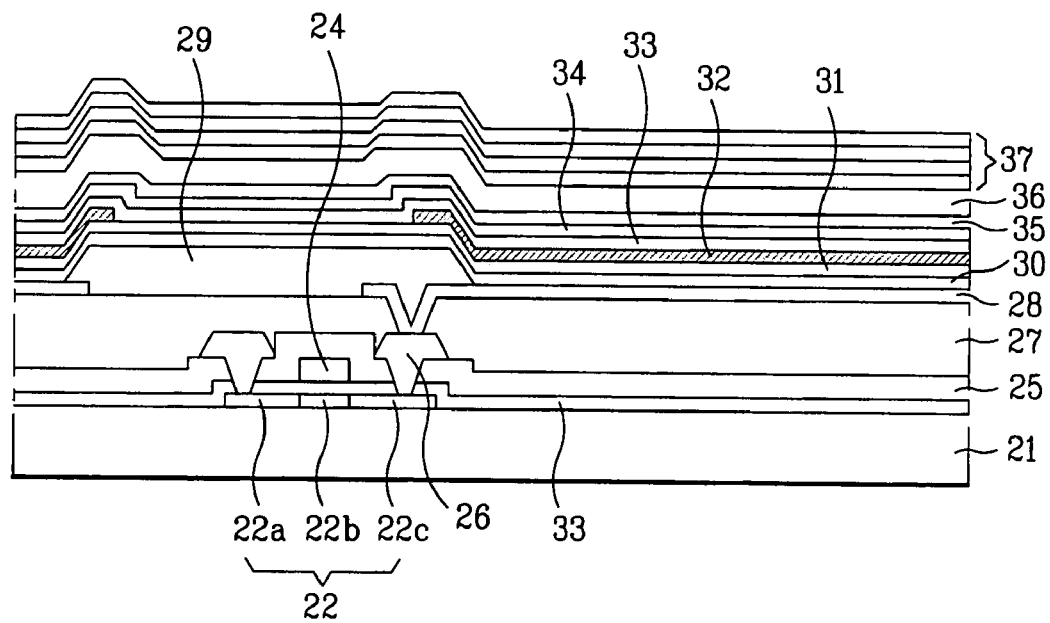

An auxiliary cathode 36, which is made of a transparent conductive material such as indium tin oxide (ITO) or indium zinc oxide (IZO), is formed over the metal cathode 35, as shown in FIG. 2D.

The metal cathode 35 may have a thin structure made of a metal material alone. Where the auxiliary cathode 36 is used, the auxiliary cathode 36 may be formed only on a portion of the metal cathode 35 which has a thin structure, as described above.

Next, a protective film 37 having a multi-layer structure is formed over the auxiliary cathode 36 to prevent oxygen and moisture from penetrating the organic EL layer.

For the protective film 37, a multi-layer thin film is typically used. In this case, the protective film 37 not only effectively prevents penetration of moisture and oxygen, but also serves as a micro-cavity, thereby providing an optimally laminated structure.

That is, the protective film 37 can greatly enhance the color purity of the display when the refractive index and thickness of each layer in the protective film 37 is optimized.

Figure 2E:
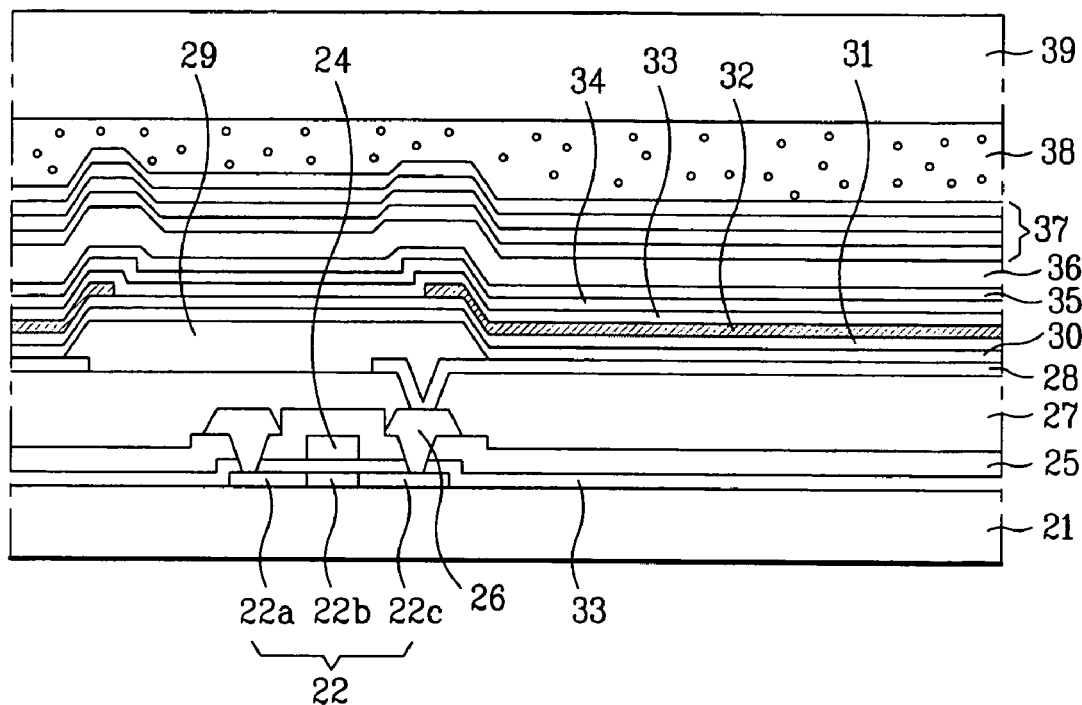

Thereafter, a sealant 38 is coated over the protective film 37, as shown in FIG. 2E. A transparent protective cap 39, which may be made of glass, is attached to the upper surface of the sealant 38. Thus, a top emission type organic EL display is completely manufactured.

Small grains are distributed in the sealant 38. The grains have a size smaller than the thickness of the sealant 38.

The small grains distributed in the sealant 38 may be made of transparent silicon or a transparent oxide or nitride which has a refractive index different from that of the sealant.

That is, the small grains may be made of silicon which is typically used in general liquid crystal displays. Alternatively, the small grains may be made of an oxide or nitride which has a high transmittancy.

The small grains may be spherical or polygonal, or may have other shapes.

The grains may also be made of an opaque material such as a metal, or may be made of other materials, which can be formed into small grains.

The small grains distributed in the sealant 38 may be made of a mixture of a transparent material and an opaque material. The transparent material may be selected from a group consisting of silicon, an oxide, and a nitride. The opaque material may be a metal.

The small grains are irregularly distributed in the sealant 38. In some cases, the small grains are regularly distributed in the sealant 38 such that they are uniformly spaced apart from one another by a predetermined distance.

Hereinafter, the reason why the sealant distributed with the small grains is used in the present invention will be described.

Figure 3:
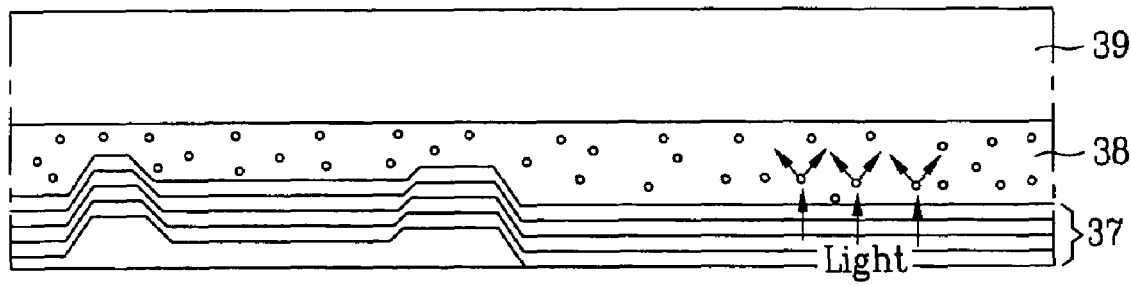
FIG. 3 is a schematic view illustrating light diffusion of a sealant according to the present invention.

FIG. 3 is a schematic view illustrating light diffusion of the sealant. As shown in FIG. 3, the small grains distributed in the sealant 38 diffuse light incident to the sealant from the protective film 37.

In accordance with the diffusion, the light is emitted in all directions. Accordingly, a wide viewing angle is obtained.

As apparent from the above description, the present invention solves the narrow viewing angle problem incurred due to the use of the protective film having the multi-thin film structure. Accordingly, it is possible to manufacture a top emission type organic EL display exhibiting a wide viewing angle.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic electro-luminescent display comprising:
   a transparent substrate;
   an anode formed over the transparent substrate;
   an organic electro-luminescent layer formed over the anode;
   a cathode formed over the organic electro-luminescent layer;
   a protective film formed over the cathode, the protective film having a multi-layer structure; and
   a sealant formed on the protective film, wherein the sealant includes small grains having a refractive index different from a refractive index of the sealant, and the small grains are irregularly distributed in the sealant and made of a transparent material selected from a group consisting of silicon and nitride.

2. The organic electro-luminescent display according to claim 1, wherein the grains distributed in the sealant have a spherical shape or a polygonal shape.

3. The organic electro-luminescent display according to claim 1, further comprising:
   a thin film transistor formed on a predetermined region of the transparent substrate, and electrically connected to the anode.

4. The organic electro-luminescent display according to claim 1, wherein:
   the anode is made of a metal having a high reflectivity and a high work function; and
   the cathode comprises a laminated structure of a transparent metal cathode and an auxiliary cathode made of a transparent conductive material.

5. A method for manufacturing an organic electro-luminescent display, comprising:
   preparing a transparent substrate, and a sealant including small grains having a refractive index different from a refractive index of the sealant, wherein the small grains are irregularly distributed in the sealant and made of a transparent material selected from a group consisting of silicon and nitride;
   sequentially forming an anode, an organic electro-luminescent layer and a cathode over the prepared transparent substrate;
   forming a protective film having a multi-layer structure over the cathode; and
   arranging the prepared sealant on the protective film.

6. The method according to claim 5, wherein the anode is made of a metal having a high reflectivity and a high work function.

7. The method according to claim 5, wherein the forming the cathode comprises:
   forming a transparent thin metal cathode over the organic electro-luminescent layer; and
   an auxiliary cathode formed over the metal cathode, the auxiliary cathode being made of a transparent conductive material.

8. The method according to claim 7, wherein the forming the metal cathode comprises:
   depositing aluminum over the organic electro-luminescent layer to a thickness of several nm, and depositing silver or an alloy of magnesium and silver over the deposited aluminum to a thickness of several nm to several tens of nm.

9. The method according to claim 7, wherein the auxiliary cathode is made of an indium tin oxide (ITO) or an indium zinc oxide (IZO).

10. The method according to claim 5, further comprising:
    forming a transistor on the transparent substrate;
    forming an insulating layer over an entire surface of the transparent substrate including the transistor; and
    removing a predetermined portion of the insulating layer to expose an electrode of the transistor,
    wherein the anode is formed on the insulating layer such that the anode is electrically connected with the exposed electrode of the transistor.

11. The method according to claim 5, wherein the forming the organic EL layer comprises:
    forming a hole injection layer over an entire surface of the transparent substrate including the anode;
    forming a hole transfer layer over the hole injection layer;
    forming a light-emitting layer over the hole transfer layer;
    forming an electron transfer layer over the light-emitting layer; and
    forming an electron injection layer over the electron transfer layer.

12. An organic electro-luminescent display comprising:
    a transparent substrate;
    an anode formed over the transparent substrate;
    an organic electro-luminescent layer formed over the anode;
    a cathode formed over the organic electro-luminescent layer;
    a multi-layer protective film on the cathode; and
    a sealant on the multi-layer protective film, the sealant having a first refractive index and the sealant including grains having a second refractive index, the grains are irregularly distributed in the sealant and made of a transparent material selected from a group consisting of silicon and nitride.

13. The organic electro-luminescent display according to claim 12, wherein, the grains have a spherical shape.

14. The organic electro-luminescent display according to claim 12, wherein, the grains have a polygonal shape.

* * * * *